United States Patent [19]

Engeler et al.

[11] 3,906,544

[45] Sept. 16, 1975

[54] SEMICONDUCTOR IMAGING DETECTOR DEVICE

[75] Inventors: William E. Engeler, Scotia; Jerome J. Tiemann, Schenectady, both of N.Y.

[73] Assignee: General Electric Company, Schenectady, N.Y.

[22] Filed: Apr. 22, 1974

[21] Appl. No.: 462,924

Related U.S. Application Data

[63] Continuation of Ser. No. 162,584, July 14, 1971, abandoned.

[52] U.S. Cl. ...................... 357/24; 357/23; 357/30; 307/304

[51] Int. Cl. ........................................... H01l 11/14

[58] Field of Search ........... 357/24, 23, 30; 307/304

[56] References Cited

UNITED STATES PATENTS

| | | | |
|---|---|---|---|
| 3,533,089 | 10/1970 | Wahlstrom | 340/173 |
| 3,623,026 | 11/1971 | Engeler | 340/173 LS |
| 3,720,922 | 3/1973 | Kosonocky | 340/173 R |

OTHER PUBLICATIONS

Weckler, Electronics, May 1, 1967, pp. 75–78.

*Primary Examiner*—Martin H. Edlow
*Attorney, Agent, or Firm*—Julius J. Zaskalicky; Jerome C. Squillaro; Joseph T. Cohen

[57] ABSTRACT

A radiation responsive semiconductor imaging device comprising an array of charge storage devices arranged in rows and columns on the surface of a semiconductor substrate. Each storage device includes a conductor-insulator-semiconductor structure in which minority carriers, controllably generated within the semiconductor in proportional response to incident electromagnetic radiation flux, are stored at the surface of the semiconductor beneath the conductor due to the application of a depletion region forming voltage to the conductor. Means are disclosed for transferring the integrated electrical charge from the storage region to a receiver region for electrical readout of the stored information. Means for reading out selected electrical charges while continuing to store other electrical charges are also disclosed. Means are also disclosed for altering the sensitivity of the array without a sacrifice in dynamic range.

5 Claims, 6 Drawing Figures

INVENTORS:
WILLIAM E. ENGELER
JEROME J. TIEMANN
by Jerome C. Squillaro
THEIR ATTORNEY INVENTORS:
WILLIAM E. ENGELER
JEROME J. TIEMANN
by Jerome C. Squillaro
THEIR ATTORNEY

SEMICONDUCTOR IMAGING DETECTOR DEVICE

This is a continuation, of application Ser. No. 162,584, filed July 14, 1971 now abandoned.

The present invention relates to methods and devices which store information for later electrical readout and more particularly to methods and devices which sense and integrate electromagnetic radiation flux, store the integrated value and are capable of electric readout from selected storage locations. This application is related to our copending applications Ser. Nos. 69,651 filed Sept. 4, 1970, and 137,238 filed Apr. 26, 1971 of common assignee as the instant application and the disclosures of which are incorporated herein by reference thereto.

Image sensing and storing devices are widely employed in video communications systems, infrared and X-ray systems, and character recognition systems. Devices employed in these systems generally store the image momentarily and then, after a selected time interval, convert the image to an electric signal. The rapid growth in the communications and character recognition fields has resulted in the introduction of numerous solid state imaging devices which are generally smaller and more reliable. Many of the devices, however, are limited to single spot imaging applications or are unable to operate in a light integration mode. The inability to integrate light precludes these devices from acting as a transitory storage device, hence, these devices provide an electric readout signal only of what the device "sees" at the instant the device is interrogated. Attempts which have been made to overcome the above limitations have resulted in complex devices in opposition to the need for simple, reliable image sensing and storing devices.

In our application Ser. No. 69,651, an improved method and apparatus for integrating and storing electrical charges in proportional response to radiation flux intensity incident on a conductor-insulator-semiconductor (CIS) structure. In that application we employ surface charge storage in a semiconductor substrate and transfer selected rows or columns of stored charge to a readout device for providing a video signal proportional to the radiation incident on the selected row or column.

Character recognition systems and small pattern optical read-in devices should additionally incorporate means for reading out stored electrical charges from selected storage locations on an array of sensing and storage devices. Further, such devices should also provide high resolution and low dark currents, to mention only a few of the more desirable attributes of such devices.

It is, therefore, an object of this invention to provide an image detector operable in a light integration mode and capable of electrical readout from selected storage locations.

Another object of this invention is to provide an image detector with an electrically alterable sensitivity without sacrificing the dynamic range of the detector.

Another object of this invention is to provide a monolithic semiconductor image detector capable of charge storage and integration with individual addressing of the storage elements.

It is still a further object of this invention to provide methods and apparatus for transferring selected electrical charges proportional to incident radiation along the surface of a semiconductor substrate while holding and integrating other electrical charges in their storage elements.

Briefly, in accord with one embodiment of our invention, an array of storage elements are arranged in an X–Y matrix of rows and columns along the surface-adjacent portions of a semiconductor substrate. Each storage element comprises a conductor-insulator-semiconductor (CIS) structure including a charge storage region, a charge transfer region, and a charge receive region. The charge storage regions are formed in the surface-adjacent portions of the semiconductor substrate under a charge-storage line which overlies the storage regions of a row of storage elements. The charge receive regions are separated from the charge storage regions by an electrical barrier region which is lowered during readout to permit charge transfer from the storage region to the receiver region. The transferred charge is then moved along the surface-adjacent portions of the semiconductor substrate to an output circuit for use as a video signal. The sensitivity of the array is electrically controlled by adjusting the charge integration time without sacrificing dynamic range.

The novel features believed characteristic of the present invention are set forth in the appended claims. The invention itself, together with further objects and advantages thereof, may be understood with reference to the following detailed description taken in connection with the accompanying drawings in which:

Figure 1:
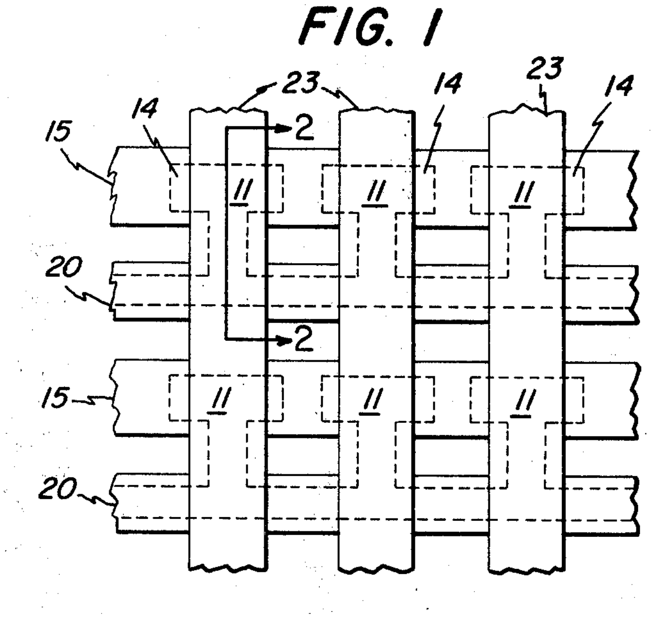
FIG. 1 is a partial plan view of an array of storage elements arranged in rows and columns.
Figure 4:
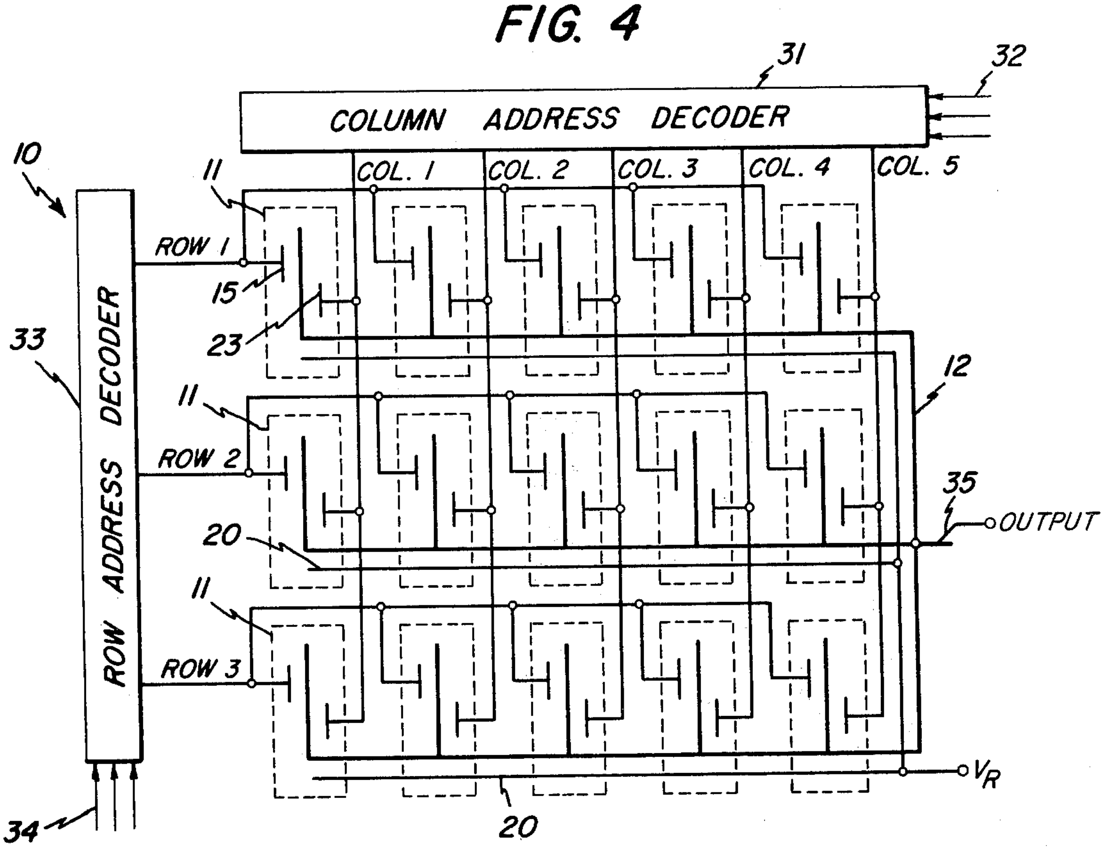
Figure 5:
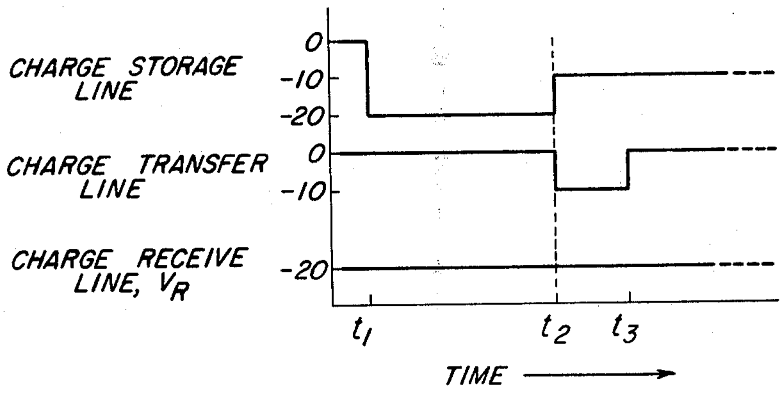

FIGS. *3a* and *3b* are partial cross-sectional views of alternative charge receiver regions useful in practicing our invention;

FIG. 4 is a schematic illustration of an array of storage elements and X–Y address lines illustrated in FIG. 1; and FIG. 5 illustrates typical voltage waveforms of the address lines during read-in and readout times.

FIG. 1 is exemplary of a semiconductor imaging device 10 in accord with one embodiment of our invention. The semiconductor imaging device 10 comprises a plurality of storage elements 11 arranged in an X–Y matrix of rows and columns. FIG. 1 illustrates two rows and three columns of a larger imaging device which may, for example, include two hundred rows and two hundred columns or more where the imaging device is used as the detecting device of a television pickup tube. Alternately, where used as a character reader, the imaging device 10 may comprise 10 rows and 10 columns. It is to be understood that the number of rows and columns of storage elements, however, is a matter of design choice and is not limited to either of the specific illustrations given above.

The storage elements 11 provide information storage and integration in the form of electrical charge at the surface-adjacent portions of a semiconductor substrate. Briefly, this storage is provided by a conductor-insulator-semiconductor (CIS) structure in which a depletion region forming voltage applied to a conductor insulatingly overlying the semiconductor substrate to form a depletion region therein so that minority carriers generated in proportional response to incident radiation can be stored and integrated at the semiconductor surface adjacent the semiconductor-insulator interface. Minority carrier integration times at the semiconductor surface are primarily limited by the rate of arrival of minority carriers due to thermal generation at interface states. Hence, the semiconductor material is selected to have a time constant for the generation of minority carriers which is long compared to the desired information storage interval. Reference may be made to commonly assigned applications Ser. Nos. 792,488 and 792,569 filed Jan. 21, 1969, for a more detailed description of charge storage in a semiconductor substrate, if desired.

Figure 2:
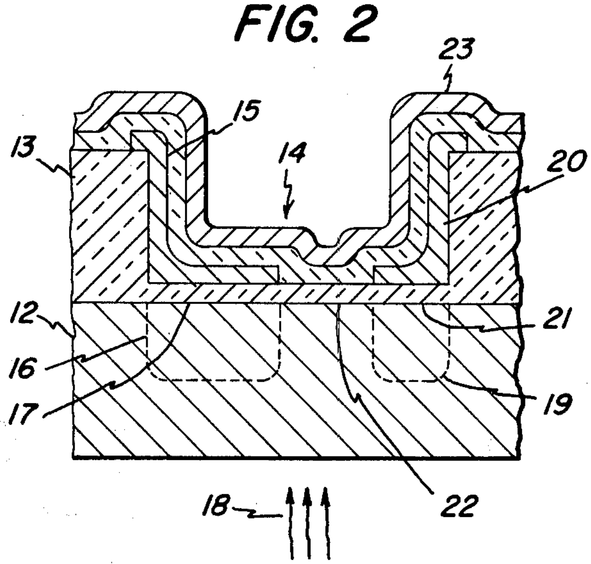
FIG. 2 is a partial cross-sectional view taken along the lines 2—2 of FIG. 1 illustrating the charge storage and charge receive regions.

FIG. 2, a cross-sectional view taken along the lines 2—2 of FIG. 1, illustrates a typical storage element 11 as comprising a semiconductor substrate 12 of one conductivity type, such as n-type silicon, for example. One major surface of the semiconductor substrate 12 is provided with an insulator layer 13 which may, for example, comprise any of the numerous useful semiconductor-insulator materials, such as silicon dioxide, silicon nitride, aluminum oxide or silicon oxynitride, for example, used separately or in combination. The insulator layer 13 includes a cellule 14 formed in the insulator layer as a region of thinner insulator material than the regions surrounding the cellule. The formation of the cellule may, for example, be provided by selective masking and etching of the insulator layer by techniques well known to those skilled in the art.

A charge storage line 15 comprising a conductive or semiconductive material, for example, overlies at least a portion of each cellule in the same row. FIG. 1, for example, illustrates a first charge storage line 15 overlying three cellules of row 1 and a second charge storage line 15 overlying three cellules of row 2. The application of a depletion region forming voltage to the charge storage line 15 relative to the substrate 12 causes the formation of a depletion region 16 in the surface-adjacent portion of the semiconductor substrate underlying the conductor 15. The depletion region 16 is confined to the area of the cellule underlying the charged storage line 15 but only in the cellular region 14 where the insulator layer thickness is sufficiently thin to permit the applied voltage to form the depletion region 16 of sufficient depth. More specifically and by way of example, an insulator layer thickness of 1,000 Angstroms in the cellular region 14 and a thickness of approximately 9,000 A outside the cellular region enables a 10-volt potential applied to the charge storage line 15 to produce the depletion region 16 illustrated in the thinner regions of the insulator but not in the thicker regions. Those skilled in the art can appreciate that the effective depth of the deplation regions can be altered by varying the magnitude of the depletion region forming voltage and/or the thickness of the insulator layer.

In accord with our invention, the depletion region 16 is used to store electrical charges in the form of minority carriers (i.e., holes for n-type semiconductor material) near the surface-adjacent portion of the semiconductor substrate 12 adjacent the semiconductor-insulator interface. This region, referred to as a charge storage region, is illustrated in FIG. 2 by the numeral 17. Electrical charges are introduced into the charge storage region 17 by electromagnetic radiation rays 18 incident on the semiconductor substrate 12 or, where electrically conductive transparent conductors are employed, through the conductors themselves.

The semiconductor imaging device 10 also includes a charge receive region 19, also formed in the surface-adjacent portion of the semiconductor substrate, however, the charge receive region 19 is formed under a charge receive line 20 which overlies a portion of a cellule 14. The charge receive line 20 is spaced from the charge storage line 15 so that the application of depletion region forming voltages to these lines do not permit the depletion regions to overlap. This non-depleted region intermediate the depletion regions 16 and 19 forms an electrical barrier to the flow of minority carriers from one storage region to the other. Hence, to controllably transfer an electrical charge from the storage region 17 to the charge receive region 21, it is necessary to lower the surface potential of this barrier region, generally referred to by the numeral 22. The surface potential of the barrier region 22 may, for example, be controlled by a voltage applied to a charge transfer line 23 comprising a conductive member insulatingly overlying the charge storage line 15 and the charge receive line 20 and substantially orthogonal thereto. FIG. 1 illustrates the charge transfer lines 23 overlying the charge storage lines 15 and charge receive lines 20 of each row of memory elements. The application of a depletion region forming voltage to the charge transfer line 23 therefore lowers the barrier region 22 on all memory elements in that column. However, as will be pointed out below, charge is only transferred between a storage region 17 and a receive region 21 if the surface potential of the storage region is above that of the receive region.

Those skilled in the art can more readily appreciate how charge is transferred from the charge storage region 17 to the charge receive region 21 by considering the following example. For cellules having an insulator layer thickness of approximately 1,000 A, the application of a depletion region forming voltage of approximately —20 volts to the charge storage line 15 of all rows in the array permits minority carriers to be stored at the semiconductor-insulator interface under the charge storage line 15. When an image is focused on the semiconductor substrate 12 in a manner illustrated in FIG. 2 by the electromagnetic radiation rays 18, the minority carriers generated by the radiation move to and are stored at the charge storage regions 17. The number of minority carriers and hence the magnitude of the charge in any one storage region is proportional to the integrated electromagnetic flux incident upon that storage region.

After the desired integration time, which may, for example, be only a fraction of a second, the stored charge from any selected storage region may be read out and used to provide a video signal. As will be described more fully below, the sensitivity of the array to light integration may be varied by electrically altering the integration time. This variation in sensitivity is achieved without sacrificing the dynamic range of operation of the array.

Readout of stored charge is achieved in accord with the embodiment of our invention illustrated in FIG. 1, by the application of a depletion region forming voltage to the charge receive line 20 and to a charge transfer line 23. For example, for selected readout from the storage region 17 of row 1 and column 1, a —20 volt potential is applied to charge receive line 20 and a —20 volt potential is applied to charge transfer line 23. Before charge is transferred, however, the surface potential of the charge storage region 17 must be raised above that of the charge receive region 21. This is achieved by changing the magnitude of the depletion region forming voltage applied to the charge storage line 15. For example, by changing the potential from −20 volts to −10 volts, the surface potential of the charge storage region is above that of the charge receive region and hence with the barrier region lowered, charge is now permitted to transfer from the storage region 17 to the receive region 19. Charge, however, is not transferred from any other storage region since charge transfer is achieved only when the surface potential of the charge storage region is above that of the charge receive region and when the barrier region is lowered. Those skilled in the art can readily appreciate that this condition only exists for the memory element 11 of row 1, column 1.

The charge transferred to the receive storage region 21 is now transferred along the surface of the semiconductor substrate 12 underlying the charge receive line 20 to a charge receive device, such as a p-n junction (not shown in FIG. 1), appropriately biased to remove the charge from the semiconductor substrate. In transferring the charge along the receive storage region 21, it is necessary to prevent the transferred charge from returning to another storage region. This is accomplished at most locations by the barrier region 22 existing under all but the selected charge transfer line, such as column 1, for example. When several rows are connected to a common charge receive device, as illustrated in FIG. 4 and described more fully below, charge might transfer to other than the addressed location of column 1. However, this may be prevented by establishing a surface potential for the receive region 19 which is below (more negative) that of the transfer barrier region 22. Reference may be made to our copending application, Ser. No. 69,649, filed Sept. 4, 1970, for a more detailed description of the operation of a p-n junction for the removal of charge from a semiconductor substrate.

Figure 3A:
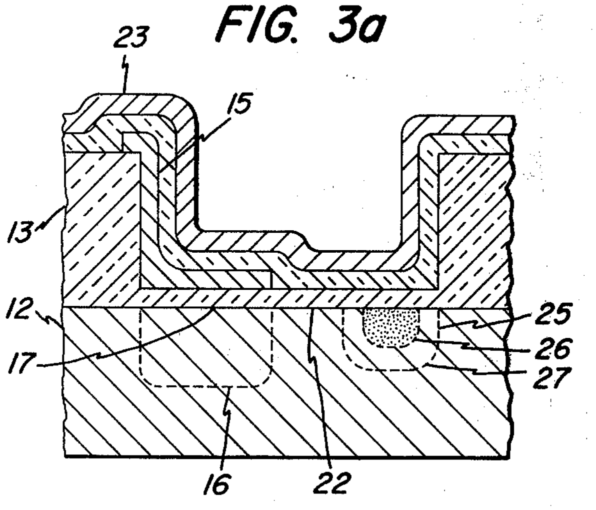

An alternative structure for receiving charge from the storage region 17 is illustrated in FIG. 3*a*. In this embodiment a surface-adjacent diffused region 26, in effect, replaces a portion or all of the charge receive line 20. This diffused region is of an opposite conductivity-type from the semiconductor substrate 12 thereby forming a p-n junction 27 and associated depletion region 25 of extended length along the surface-adjacent portions of the semiconductor substrate 12. In accord with another aspect of our invention, the conductivity of the diffused region 26 may be enhanced and the speed of charge transfer improved by the formation of a separate conductor overlying or adjacent the diffused region and in electrical contact therewith.

Figure 3B:
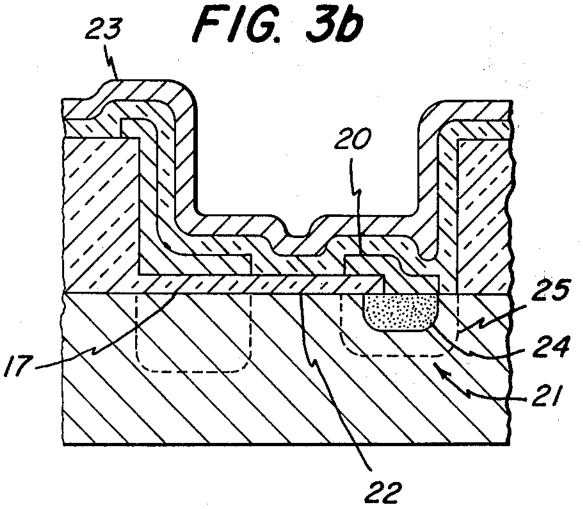

FIG. 3*b* illustrates still another structure for receiving charge from the storage region 17. In this embodiment the charge receive region 21 includes a portion of a charge receive line 20 adjacent a diffused region 24 of opposite conductivity-type from said substrate and in electrical contact with the diffused region. Charge which is transferred from the storage region 17 is first received within the depletion region 25 underlying charge receive line 20 and then to the p-n junction formed by the diffused region 24 in the substrate. Of the three disclosed embodiments, this embodiment exhibits the lowest impedance for charge transfer. It is to be understood that in making electrical contact with diffused regions 24 or 26, a continuous contact to the diffused regions is not necessary and that periodic contact points may be employed if desired, without departing from the spirit and scope of our present invention.

The alternative charge receive devices illustrated in FIGS. 3*a* and 3*b* operate in substantially the same manner as those described above with reference to FIGS. 1 and 2. In these latter configurations, however, electrical charges are received from the storage regions 17 by the application of a potential which reverse biases the p-n junction such that when the barrier region 22 is lowered, the electrical charges stored in the storage region 17 are attracted to the depletion region 25 surrounding the p-n junction. A more detailed description of the use of diffused regions for receiving and conducting charges along the surface-adjacent portions of a semiconductor substrate is found in our copending application Ser. No. (137238). In each of the embodiments of our invention illustrated in FIGS. 2, 3*a* and 3*b*, for example, electrical charges are transferred from the storage regions to the receive regions for electrical readout without injection of the charge into the semiconductor bulk. This ensures rapid charge transfer while minimizing losses to the semiconductor substrate.

FIG. 4 schematically illustrates an imaging device 10 comprising a 3 × 5 matrix of storage elements 11, each comprising a charge storage line 15, a charge receive line 20 and a charge transfer line 23. Each charge transfer line 23 is electrically connected to a column address decoder 31 having a plurality of input lines 32 for addressing selected columns of storage elements. The charge storage lines 15 are electrically connected to a row address decoder 33 having a plurality of input lines 34 for addressing selected rows of storage elements. The charge receive lines 20 of each storage element are electrically connected together and to a source of bias potential $V_R$, for establishing the depletion regions 19 associated with each storage element 11. An electrical output signal is derived from the semiconductor imaging device 10 with a charge receive device 35, which may, for example, comprise a p-n junction or a bipolar transistor, where signal gain is desired. The charge receive device 35 as well as the column and row address decoders 31 and 32, respectively, are advantageously formed in the semiconductor substrate 12 as integrated circuit elements.

The operation of the semiconductor imaging device 10 schematically illustrated in FIG. 4 can be understood by those skilled in the art by considering the sequence of events which occur when an image is focused thereon. For example, the application of a depletion region forming voltage to all charge storage lines 15 enables all storage elements 11 to integrate the electromagnetic flux intensity in the form of minority carriers in the respective storage regions 17. After a suitable integration time, depending in part upon the particular application for the imaging device, electrical readout from selected storage regions is provided by selected row and column addressing of the storage elements. For example, if it is desired to read out the electrical charge stored in column 2, row 3, a depletion region forming voltage is applied to conductor 23 of column 2 and the depletion region forming voltage applied to row 3 is reduced in amplitude to raise the surface potential of the charge storage regions of row 3 above the charge receive regions of the same row. In this way, the electrical charge stored in the storage region 17 of column 2, row 3 is permitted to flow to the charge receive region 21 underlying the charge receive line 20 (or where alternate embodiments of FIGS. 3*a* and 3*b* are employed, as described above). The electrical charge is then transferred along the surface-adjacent portions of the semiconductor substrate 12 under the influence of the electric field from the conductor 20 to the charge receive 35 from which an electrical output signal is obtained. The amplitude of the electric signal is proportional to the magnitude of the stored charge which itself is proportional to the intensity of the incident electromagnetic radiation. Hence, the amplitude of the output signal is proportional to the incident radiation.

Electrical readout of stored charge from other charge storage regions is provided with equal facility by addressing other rows and columns of storage elements. Those skilled in the art can readily appreciate that various combinations of row and column addressing may be utilized to read out selected rows or selected columns or all rows and all columns of storage elements, depending upon the requirements of the particular application.

By way of example, FIG. 5 illustrated a particularly useful method for addressing (or coding) row and column-oriented storage elements. At time $t_1$, all or selected charge storage lines are activated by the application of a depletion region forming voltage. After the desired integration time, for example, $t_1$ to $t_2$, the integrated charge in selected storage regions is transferred to its associated charge receive region. Charge transfer is effected by (between $t_2$ and $t_3$) the application of a depletion region forming voltage to a selected charge transfer line 23. The transferred charge is then read out of the charge receive device 35 as a change in potential as described above.

In view of the foregoing description, several advantageous characteristics of our invention should now be apparent to those skilled in the art. For example, the imaging device in accord with our invention provides substantially continuous read-in of incident radiation in all storage regions of the array except for any storage region which may be selected for readout. However, since readout is a small portion of the total cycle time of the array, substantially continuous read-in is provided. This makes our invention particularly useful for low light level environments where a high degree of sensitivity is required. Further, by reducing the read-in time (or charge integration time), the sensitivity of the device may be reduced, if desired. For example, by adjusting the integration time, $t_1$ to $t_2$, as illustrated in FIG. 5, the sensitivity of the array can be varied. For times other than $t_1$ to $t_2$ and readout of a particular row, the charge storage line is held at ground potential, thereby preventing the accumulation (integration) of optically generated minority carriers at the storage regions. In this way, the sensitivity of the array is altered without a sacrifice in its dynamic range.

Another characteristic feature of our invention is the ability to provide readout from selected storage regions while processing the stored charge from numerous selected storage regions with equal facility. This characteristic of our invention is particularly useful for character or small pattern recognition applications. Additionally, in view of the structural configuration of imaging devices in accord with our invention, high density arrays of storage elements are easily provided. High resolution is therefore a dominant characteristic of our invention. In addition to high density of storage elements, those skilled in the art can readily appreciate that the semiconductor substrate 12 must be sufficiently thin so that radiation incident upon the semiconductor substrate and the minority carriers generated thereby move quickly and directly to the nearest storage region.

In practicing our invention, numerous combinations of conductors, insulators and semiconductors may be employed. For example, suitable conductive materials for forming the charge storage, charge receive and charge transfer lines include materials such as refractory metals including molybdenum, tungsten and chromium, or even semiconductive materials such as polycrystalline silicon. This latter material is useful when the structure is to be functioned with transparent electrodes and upper surface interconnections. Aluminum and other convenient materials may be used for upper metalizations and interconnections when desired. Useful insulating materials include silicon dioxide, silicon nitride, aluminum oxide and combinations thereof, for example. Typical semiconductor materials include silicon, germanium, Group III-V semiconductor compounds such as gallium arsenide, gallium phosphide or indium arsenide, for example. The choice of material depends on the long wavelength limit desired, as is well-known to those skilled in the art. For example, for long wavelength infrared detection, narrow bandgap materials are desired. In this instance, it is also useful and desirable to operate the array at cryogenic temperatures.

Semiconductor imaging devices are constructed in accord with our invention by first forming a thick insulating layer 13 over the semiconductor substrate and then patterning the insulating layer to form the cellular regions therein. The insulating layer is then covered with a conductive or semiconductive material and suitably patterned to provide the charge storage and charge receive lines 15 and 20, respectively. Another insulating layer is then formed over the patterned conductors and another layer of conductive material is formed thereon. This layer of conductive material is patterned to produce the charge transfer lines 23. Those skilled in the art can readily appreciate that the thicknesses of the insulating layers and the conductive layers may vary depending upon the magnitudes of the desired bias voltages to be applied to the conductors. Accordingly, those skilled in the art can readily appreciate that our invention is not limited to any specific method of manufacture or specific thicknesses of insulator material and conductor material. However, reference may be made to the aforementioned copending applications for examples of typical methods for making storage elements which are suitable for practicing our invention.

In summary, we have provided an improved semiconductor imaging device employing an array of storage elements wherein electromagnetic radiation incident on the storage elements is converted to minority carriers and stored in the form of electrical charge near the surface-adjacent portions of a semiconductor substrate. Means for addressing selected rows and columns of storage elements for electric readout of the stored information is also described.

While our invention is described with respect to certain specific embodiments, many modifications and variations will occur to those skilled in the art. Accordingly, by the appended claims we intend to cover all such modifications and changes as fall within the true spirit and scope of our present invention.

What we claim as new and desire to secure by letters patent of the United States is:

1. A radiation responsive array of conductor-insulator-semiconductor storage elements comprising a substrate of semiconductor material of one conductivity type, an insulator layer overlying a major surface of said substrate, said insulator layer having a plurality of cellular regions therein each of substantially lesser thickness than surrounding regions thereof, said cellular regions arranged into a pair of rows and a plurality of columns, a pair of charge storage lines each overlying and contiguous with the cellular regions of a respective row and defining a respective row of charge storage regions in an underlying surface adjacent portion of said substrate, a region of opposite conductivity type in said surface adjacent portion of said substrate spaced from each of said charge storage regions and forming a plurality of charge receive regions each spaced from a respective charge storage region and defining a respective barrier therebetween, said barrier regions arranged in a pair of rows and a plurality of columns, a plurality of conductors, each overlying a respective column of barrier regions, means for applying alternatively a first and a second voltage to each of said charge storage lines in relation to said substrate to form respective low and intermediate surface potentials in the storage regions underlying said charge storage lines, means for applying alternatively third and fourth voltages to each of said conductors in relation to said substrate for establishing surface potentials at said barrier regions to control the transfer of electrical charge between charge storage regions and charge receive regions, said third voltage on said conductors being set in relation to said second voltage on said storage lines to inhibit the transfer of charge from said charge storage regions to said charge receive regions and said fourth voltage on a conductor being set in relation to said second voltage on a storage line to permit the transfer of charge from the charge storage region so addressed to a corresponding charge received region, means for establishing a potential in said region of opposite conductivity type which is below the potential established at said barrier regions in response to the application of said fourth voltage to said conductors overlying said barrier regions, means for applying said first voltage to one of said storage lines while applying said second voltage to the other of said storage lines, means for applying said fourth voltage to a selected column conductor while applying said third voltage to the other column conductors, whereby charge is transferred from a storage region of said other row addressed by said selected column conductor to said region of opposite conductivity type and no charge is transferred from the other storage regions of said rows to said region of opposite conductivity type.

2. The radiation responsive array of claim 1 in which means are provided for exposing said substrate to electromagnetic radiation to generate charges therein for storage in said storage regions and in which said fourth voltage is applied in sequence to each said conductors while said third voltage is applied to the other of said conductors whereby charge stored in said storage regions is transferred in sequence to corresponding charge receive regions.

3. A radiation responsive array of conductor-insulator-semiconductor storage elements comprising a substrate of semiconductor material of one conductivity type, an insulator layer overlying a major surface of said substrate, said insulator layer having a plurality of cellular regions therein each of substantially lesser thickness than surrounding regions thereof, said cellular regions arranged into a plurality of rows and a plurality of columns, a plurality of charge storage lines each overlying and contiguous with the cellular regions of a respective row and defining a respective row of charge storage regions in an underlying surface adjacent portion of said substrate, a plurality of regions of opposite conductivity type in said surface adjacent portion of said substrate each spaced from a respective row of charge storage regions and forming a plurality of charge receive regions therewith, each charge receive region spaced from a respective charge storage region and defining a respective barrier therebetween, said barrier regions arranged in a plurality of rows and a plurality of columns, said regions of opposite conductivity type being connected in common, a plurality of conductors, each overlying a respective column of barrier regions, means for applying alternatively a first and a second voltage to each of said charge storage lines in relation to said substrate to form respective low and intermediate surface potentials in the storage regions underlying said charge storage lines, means for applying alternatively third and fourth voltages to each of said conductors in relation to said substrate for establishing surface potentials at said barrier regions to control the transfer of electrical charge between charge storage regions and charge receive regions, said third voltage on said conductors being set in relation to said second voltage on said storage lines to inhibit the transfer of charge from said charge storage regions to said charge receive regions and said fourth voltage on a conductor being set in relation to said second voltage on a storage line to permit the transfer of charge from the charge storage region so addressed to a corresponding charge receive region, means for establishing a potential in said regions of opposite conductivity type which is below the potential established at said barrier regions in response to the application of said fourth voltage to said conductors overlying said barrier regions, means for individually applying said second voltage to a selected one of said storage lines while applying said first voltage to the other of said storage lines, means for individually applying said fourth voltage to a selected column conductor while applying said third voltage to the other of said column conductors, whereby charge is transferred from a storage region identified by said selected storage line and said selected column conductor to said regions of opposite conductivity type and no charge is transferred from the other storage regions of said rows to said regions of opposite conductivity type.

4. The radiation responsive array of claim 3 including means for sequentially applying said fourth voltage to each of said column conductors while applying said third voltage to the other of said column conductors.

5. The radiation responsive array of claim 4 including means for sequentially applying said second voltage to each of said storage lines while applying said first voltage to the other of said storage lines.

* * * * *